(12) United States Patent
Mukhopadhyay et al.

(10) Patent No.: US 6,399,448 B1
(45) Date of Patent: Jun. 4, 2002

(54) METHOD FOR FORMING DUAL GATE OXIDE

(75) Inventors: Madhusudan Mukhopadhyay; Chivukula Subrahmanyam; Yelehanka Ramachandramurthy Pradeep, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/443,426

(22) Filed: Nov. 19, 1999

(51) Int. Cl.[7] .......................................... H01L 21/8234
(52) U.S. Cl. ......................... 438/275; 438/528; 438/981
(58) Field of Search ................................. 438/275, 289, 438/290, 291, 407, 528, 966, 981

(56) References Cited

U.S. PATENT DOCUMENTS

| | | | |
|---|---|---|---|
| 4,597,164 A | 7/1986 | Havemann | 29/576 W |
| 5,330,920 A | 7/1994 | Soleimani et al. | 437/24 |
| 5,624,866 A | 4/1997 | Kim | 438/426 |
| 5,668,035 A | 9/1997 | Fang et al. | 438/239 |
| 5,672,521 A | 9/1997 | Barsan et al. | 437/24 |
| 5,866,445 A | 2/1999 | Baumann | 438/199 |
| 5,891,798 A | 4/1999 | Doyle et al. | 438/624 |
| 5,918,116 A | 6/1999 | Chittipeddi | 438/199 |

FOREIGN PATENT DOCUMENTS

JP 7-94503 * 4/1995

OTHER PUBLICATIONS

Wolf, "Silicon Processing for the VLSI Era", vol. 1, pp. 321–325, 1986.*

* cited by examiner

*Primary Examiner*—Chandra Chaudhari
(74) *Attorney, Agent, or Firm*—George O. Saile; Rosemary L. S. Pik; Stephen G. Stanto

(57) ABSTRACT

A method for forming a multiple thickness gate oxide layer by implanting nitrogen ions in a first area of a semiconductor substrate while a second area of the semiconductor substrate is masked; implanting argon ions into the second area of the semiconductor substrate while the first area of the semiconductor substrate is masked; and thermally growing a gate oxide layer wherein, the oxide growth is retarded in the first area and enhanced in the second area. A threshold voltage implant and/or an anti-punchthrough implant can optionally be implanted into the semiconductor substrate prior to the nitrogen implant using the same implant mask as the nitrogen implant for a low voltage gate, and prior to the argon implant using the same implant mask as the argonm implant for a high voltage gate, further reducing processing steps.

12 Claims, 2 Drawing Sheets

METHOD FOR FORMING DUAL GATE OXIDE

BACKGROUND OF INVENTION

1) Field of the Invention

This invention relates generally to fabrication of a semiconductor device and more particularly to a method for forming a dual gate oxide in a dual voltage process.

2) Description of the Prior Art

Modem integrated circuit devices commonly contain transistors and other circuit elements that operate at differing voltage levels. For example, integrated circuit devices that contain non-volatile memories usually contain both high and low voltage circuit elements. Such non-volatile memories typically include circuit elements that operate at relatively high voltage levels for program and erase operations as well as other circuit elements that operate at relatively low voltage levels.

High voltage circuit elements such as program and erase transistors are usually formed over a semiconductor substrate, or wafer, on a relatively thick gate oxide layer. Such relatively thick gate oxide layers are required to prevent breakdown in a high voltage operating environment. However, it is preferable for the low voltage circuit elements to be formed on a relatively thin gate oxide layer. Such thin gate oxide layers typically increase the speed of such circuit elements. For example, transistors having relatively short gate lengths and thin oxide layers typically provide increased operating speeds.

To accommodate the need for circuit elements which must operate at different voltages, modern integrated circuits are commonly fabricated using a dual gate oxide (e.g. a gate oxide layer having two different thicknesses) or multiple gate oxide thicknesses. One approach to fabrication of a gate oxide layer having multiple thicknesses involves multiple masking and oxide formation steps. Typically, a first oxide sublayer is grown on the semiconductor substrate. The first oxide sublayer is usually masked with a photoresist mask and the unmasked portions of the first oxide sublayer are stripped away in the area where a thin oxide layer is desired. The photoresist mask is then stripped away and a second oxide sublayer is grown on the semiconductor substrate to form thin oxide areas, and on the first oxide sublayer to form thick oxide areas. However, the photoresist mask is difficult to remove completely, and photoresist residue reduces the overall quality of the subsequently formed second oxide sublayer.

Another approach to fabrication of a gate oxide layer having multiple thicknesses is to grow an oxide layer having the greater off the desired thicknesses. Then masking the areas where a thick oxide is desired using a photoresist mask, and etching the exposed areas of the oxide layer to the thinner of the desired thicknesses. However, it is difficult to control the thickness of the etched areas of the oxide layer, hindering the performance and reliability of the device formed on the thin oxide areas.

Yet another approach to fabrication of a gate oxide layer having multiple thicknesses is to implant N-type ions which enhance oxide growth and nitrogen ions which retard oxide growth. A first implant mask is formed over the semiconductor substrate having openings over areas where a second oxide thickness is desired, and N-type ions are implanted into the semiconductor substrate through the openings. The implant mask is removed, and the N-type ions are driven in with a thermal anneal. A second implant mask is formed having openings over areas where a first oxide thickness and a second oxide thickness are desired, and nitrogen ions are implanted into the semiconductor substrate through the openings in the second implant mask. An oxide layer is then grown having a first thickness where only nitrogen ions have been implanted, a second thickness where both N-type and nitrogen ions have been implanted, and a third thickess where no ions have been implanted. While this process is benificial in applications where an N-type doped region is desired beneath a second thickness oxide, such a doped region is not desirable in some applications, such as dual voltage devices and multiple voltage devices. Also, this process requires separate masking steps and a thermal anneal, increasing the thermal budget, cycle time, and fabrication costs.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,672,521 (Barson et al.) shows a multiple thickness oxide layer formed by implanting nitrogen ions into a semiconductor substrate to retard oxide growth with or without N-type ions to enhance oxide growth to make varing thicknesses of relatively thin oxide, and using undoped areas of the semiconductor substrate to grow relatively thick oxide.

U.S. Pat. No. 5,918,116 (Chittipeddi) shows a dual gate oxide process by an amorphizing ion implant, preferably silicon.

U.S. Pat. No. 5,624,866 (Kim) shows an ion implant to enhance oxide growth wherein argon is one of several suitable ion species.

U.S. Pat. No. 4,597,164 (Havermann teaches a dual oxide method by doping a thick oxide area.

U.S. Pat. No. 5,668,035 (Fang et al.) shows a dual thickness gate oxide process by a masking step.

U.S. Pat. No. 5,330,920 (Soleimani et al.) and U.S. Pat. No. 5,891,798 (Doyle et al.) teach a gate oxide method by nitridizing or implanting $N_2$ ions into a semiconductor substrate.

U.S. Pat. No. 5,866,445 (Baumann) shows a dual gate oxide thickness using a $N_2$ ion implant.

SUMMARY OF THE INVENTION

It is an object of the present invention to provide a method for forming a dual thickness gate oxide using a nitrogen ion implant to retard oxide growth in a first area and an argon ion implant to enhance oxide growth in a second area.

It is another object of the present invention to provide a method for forming a multiple thickness gate oxide using a nitrogen ion implant to retard oxide growth in a first area to provide a first thickness, using an argon ion implant to enhance oxide growth in a second area to provide a second thickness, and using an undoped third area provide a third thickness in a subsequently grown oxide layer.

It is yet another object of the present invention to provide a method for forming a multiple thickness gate oxide with reduced thermal budget and reduced processing steps by using a nitrogen ion implant to retard oxide growth in a first area and an argon ion implant to enhance oxide growth in a second area, with or without an third area.

To accomplish the above objectives, the present invention provides a method for forming a multiple thickness gate oxide layer. The process begins by providing a semiconductor substrate having a silicon surface. The semiconductor substrate has a first area and a second area, and may further comprise an optional third area. Nitrogen ions into the first area while masking the second area and the third area to form a first region in which thermal oxide growth is retarded. Argon ions are implanted into the so area while masking the first area and the third area to form a second region in which thermal oxide growth is enhanced. A gate oxide layer is thermally grown over the first region, the second region, and the third region; wherein the gate oxide layer has a first thickness over the first region, a second thickness over the second region, and a third thickness in the third area. The second thickness is greater than the first thickness and the third thickness, and the third thickness is greater than the first thickness.

The present invention provides considerable improvement over the prior art. The key advantages of the present invention are that a multiple thickness gate oxide layer can be formed using an easily manufacturable single oxide growth process with a reduced thermal budget and reduced processing steps. The thick area is not doped with N-type ions. Also, since the thin gate is grown at the same time as the thick gate in a single oxidation step, boron is not lost from the thin gate area during the first (thick gate) oxidation step, and a compensation implant is not needed.

Another key advantage is that a threshhold voltage implant and/or an anti-punchthrough implant can optionally be implanted into the semiconductor substrate prior to the nitrigen implant using the same implant mask as the nitrogen implant for a low voltage gate, and prior to the argon implant using the same implant mask as the argon implant for a high voltage gate, further reducing processing steps.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for forming a multiple thickness gate oxide layer using a nitrogen ion implant to retard oxide growth in a first area and an argon ion implant to enhance oxide growth in a second area, then thermally growing a gate oxide layer having a first thickness in the first area and a second thickness, greater than the first thickness, in the second area.

Figure 1:
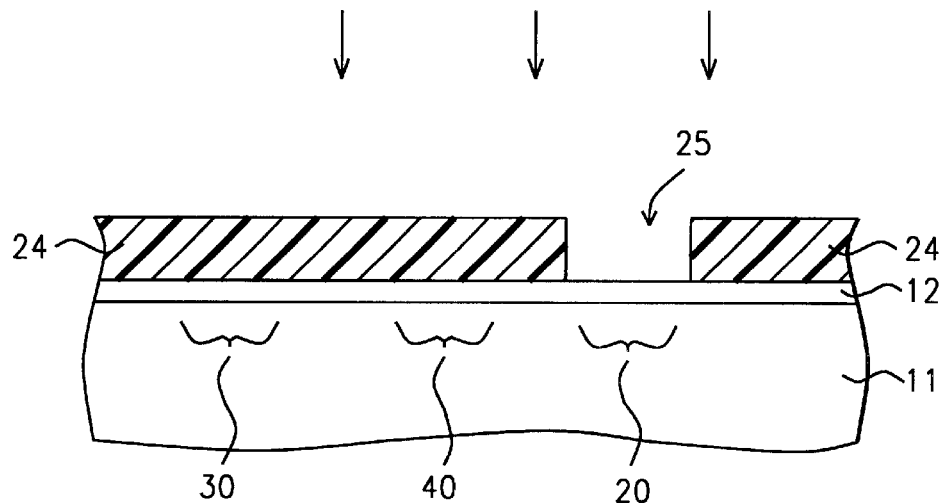
FIGS. 1, 2, 3 & 4 illustrate sequential sectional views of a process for forming a gate oxide layer having multiple thicknesses according to the invention.

Referring to FIG. 1, the present invention begins by providing a semiconductor substrate (11) having a silicon surface. Semiconductor substrate (11) should be understood to possibly include a monocrystalline silicon wafer or any of a number of like structures, including a silicon-on-insulator (SOI) structure or a structure having a polycrystalline silicon top layer, as are known in the art. The semiconductor substrate (11) has a first area (20) and a second area (30). The semiconductor may further include an optional third area (40).

Referring again to FIG. 1, a sacrificial oxide layer (12) is formed over the semiconductor substrate (11). The sacrificial oxide layer (12) is preferably thermally grown to a thickness of between about 180 Angstroms and 220 Angstroms, and most preferably about 200 Angstroms.

Still referring to FIG. 1, a first implant mask (24) is formed over the sacrificial oxide layer (12), having an opening (25) over the first area (20) of the semiconductor substrate (11). The first implant mask can be composed of photoresist and can be formed using photolithography (e.g. deposit photoresist layer, expose, develop, and etch). As shown in FIG. 1, the second area (30) and the optional third area (40) are covered by the first implant mask.

A first threshhold voltage implant and/or an anti-punchthrough implant can optionally be implanted into the first area (20) of the semiconductor substrate (11) through the first implant mask (24) to provide the desired characteristics for a subsequently formed gate. An advantage of the present invention is that threshhold voltage and/or anti-punchthrough implants and a multiple thickness gate oxide can be formed using the same implant mask.

Figure 2:
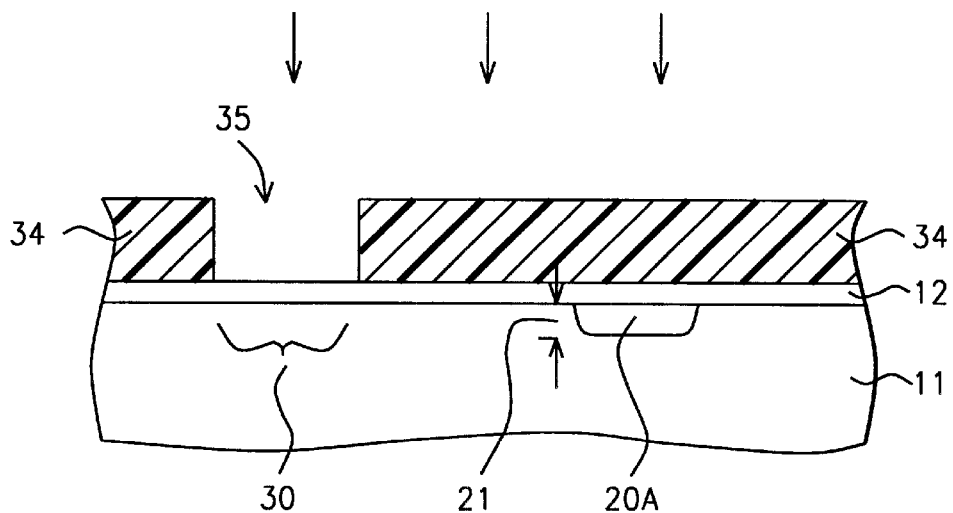
Figure 3:
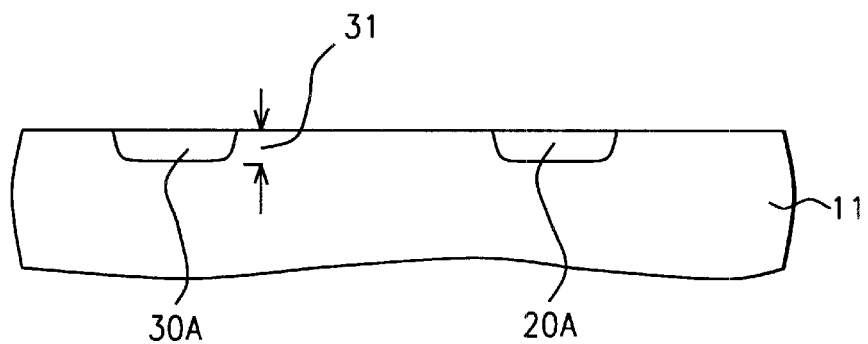
Figure 4:
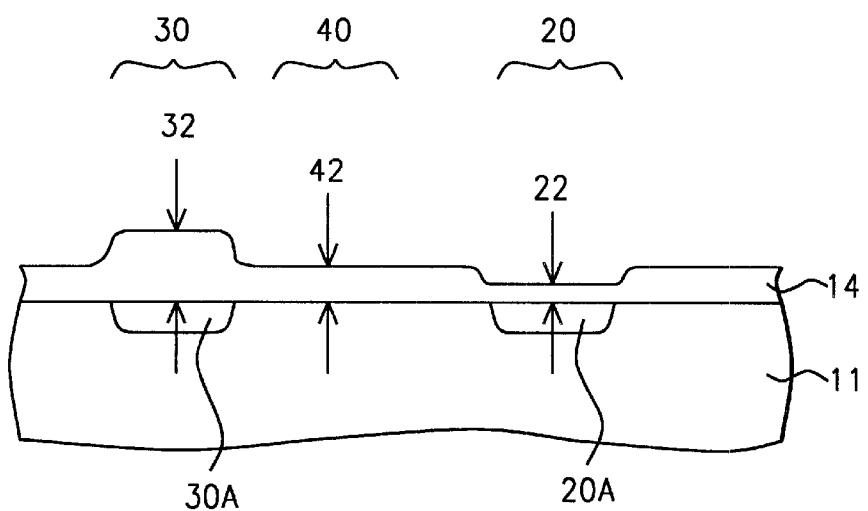

Still referring to FIG. 1, nitrogen ($N_2$) ions are implanted into the semiconductor substrate (11) through the opening (25) in the first implant mask (24). The nitrogen ions are preferably implanted at an energy of between about 5 KeV and 100 KeV and at a dose of between about 1E10 atm/$cm^2$ and 1E16 atm/$cm^2$. The nitrogen ions are preferably implanted to a depth of between about 5 Angstroms and 100 Angstroms below the substrate surface. The nitrogen ion implant forms a nitrogen doped first region (20A) as shown in FIGS. 2, 3 & 4. This first region (20A), which has a concentration of between about 1E10 atm/$cm^3$ and 1E16 atm/$cm^3$ of nitrogen ions and a depth (21) of between about 5 Angstroms and 100 Angstroms, retards oxide growth by about 10% to 20% compared to an unimplanted area of the substrate.

The first implant mask (24) is then removed. A first implant mask (24) composed of photoresist, can be removed using a dry ashing process and a chemical resist strip (CRS) process as is known in the art.

Referring to FIG. 2, a second implant mask (34) is formed over the sacrificial oxide layer (12). The second implant mask (34) has an opening (35) over the second area (30) of the semiconductor substrate (11). The second implant mask (34) can be composed of photoresist and can be formed using photolithography (e.g. deposit photoresist layer, expose, develop, and etch). As shown in FIG. 2, the first area (20) and the optional third area (40) are covered by the first implant mask.

A second threshhold voltage implant and/or an anti-punchthrough implant can optionally be implanted into the second area (30) of the semiconductor substrate (11) through the second implant mask (34) to provide the desired characteristics for a subsequently formed gate. Again an advantage of the present invention is that threshhold voltage and/or anti-punchthrough implants and a multiple thickness gate oxide can be formed using the same implant mask.

Still referring to FIG. 2, argon ions are implanted into the second area (30) of the semiconductor substrate (11) through the opening (35) in the second implant mask (34). The argon ions are preferably implanted at an energy of between about 10 KeV and 100 KeV and at a dose of between about 1E10 atm/cm$^2$ and 1E16 atm/cm$^2$. The argon ion implant forms an argon doped second region (30A) as shown in FIGS. 3 & 4. This second region (30A) enhances oxide growth by about 20% to 30% compared to an unimplanted area of the substrate surface. The second region (30A) has a concentration of between about 1E10 atm/cm$^3$ and 1E16 atm/cm$^3$ of argon ions and a depth (31) of between about 5 Angstroms and 100 Angstroms.

Referring to FIG. 3, the second implant mask (not shown) and the sacrificial oxide layer (12) are removed. A second implant mask (34) composed of photoresist, can be removed using a dry ashing process and a CRS process as is known in the art. The sacrificial oxide layer (12) can be removed using a variety of processes known in the art, including: RIE using $CHF_3CF_4$, wet etch using HF and $NH4F$, RCA, or buffered oxide echant, most preferably RCA.

Referring to FIG. 4, a gate oxide layer (14) is thermally grown over the first region (20A) and the second region (30A) of the semiconductor substrate. The gate oxide layer (14) is preferably grown at a temperature of between about 700° C. and 900° C. in an oxygen containing atmosphere. The gate oxide layer (14) can be grown in oxygen (dry oxidation) or oxygen and hydrogen (wet oxidation).

Due to the presence of nitrogen ions in the first region (20A), the gate oxide layer (14) has a first thickness (22) overlying the first region (20A) which is between about 10% and 20% less than the thickness would be over an undoped area. The presence of argon ions in the second region (30A) causes the gate oxide layer (14) to have a second thickness (32) which is between about 20% and 30% more than the thickness would be over an undoped area. An optional undoped third area (40) would not be effected by the nitrogen implant or the argon implant and would have the thickness (42) for which the thermal growth cycle was programmed.

For example, a semiconductor substrate having a nitrogen doped first region (20A), an argon doped second region (30A), and an undoped third area (40), as described hereabove, is exposed to a thermal growth cycle programmed to grow a gate oxide layer having a thickness of about 90 Angstroms over undoped silicon. The resulting gate oxide layer (14) has a first thickness (22) of between about 50 Angstroms and 80 Angstroms over the first region (20A). Over the second region (30A), the resulting gate oxide layer (14) has a second thickness (32) of between about 100 Angstroms and 130 Angstroms. In the third area (40), the gate oxide layer (14) has a third thickness (42) of between about 80 Angstroms and 100 Angstroms. It should be understood that the above example is intended to be descriptive and is not intended as a limitation of the present invention. The first and second thicknesses depend upon the doses and energies of the nitrogen and argon implantations. Preferably, the gate oxide layer over the first region (20A) has a first thickness (22) of between about 20 Angstroms and 100 Angstroms; the gate oxide layer over the second region (30A) has a second thickness (32) of between about 40 Angstroms and 200 Angstroms; and the gate oxide layer over the third area (40) has a third thickness (42) of between about 30 Angstroms and 175 Angstroms.

While the invention has been particularly shown and described with reference to the preferred embodiments thereof, it will be understood by those skilled in the art that various changes in form and details may be made without departing from the spirit and scope of the invention.

What is claimed is:

1. A method for forming a multiple thickness gate oxide layer, comprising the steps of:
   a. providing a semiconductor substrate having a silicon surface; said semiconductor substrate having a first area, a second area, and a third area;
   b. forming a sacrificial oxide layer over said semiconductor substrate;
   c. implanting nitrogen ions into said first area while masking said second area and said third area to form a first region in which thermal oxide growth is retarded;
   d. implanting argon ions into said second area while masking said first area and said third area to form a second region in which thermal oxide growth is enhanced;
   e. removing said sacrificial gate oxide layer;
   f. thermally growing a gate oxide layer over said first area, said second area, and said third area; said gate oxide layer having a first thickness over said first region, a second thickness over said second region, and a third thickness over said third area; wherein said second thickness is greater than said first thickness and said third thickness, and said third thickness is greater than said first thickness; and
   g. forming gates on the different thickness oxide layers; whereby the gates can be operated at different voltages.

2. The method of claim 1 wherein said first thickness is between about 20 Angstroms. and 100 Angstroms, said second thickness is between about 40 Angstroms and 200 Angstroms, and said third thickness is between about 30 Angstroms and 175 Angstroms.

3. The method of claim 1 wherein said first region is formed by implanting nitrogen ions at an energy of between about 5 KeV and 100 KeV and at a dose of between about 1E10 atm/cm$^2$ and 1E16 atm/cm$^2$.

4. The method of claim 1 wherein said second region is formed by implanting argon ions at an energy of between about 10 KeV and 100 KeV and at a dose of between about 1E10 atm/cm$^2$ and 1E16 atm/cm$^2$.

5. The method of claim 3 wherein said second region is formed by implanting argon ions at an energy of between about 10 KeV and 100 KeV and at a dose of between about 1E10 atm/cm$^2$ and 1E16 atm/cm$^2$.

6. The method of claim 3 wherein said first region has a concentration of between about 1E10 atm/cm$^3$ and 1E16 atm/cm$^3$ of nitrogen ions and a depth of between about 5 Angstroms and 100 Angstroms, and second region has a concentration of between about 1E10 atm/cm$^3$ and 1E16 atm/cm$^3$ of argon ions and a depth of between about 5 Angstrom and 100 Angstroms.

7. A method for forming a multiple thickness gate oxide layer, comprising the steps of:
   a. providing a semiconductor substrate having a silicon surface; said semiconductor substrate having a first area and a second area;
   b. forming a sacrificial oxide layer over said semiconductor substrate;
   c. forming a first implant mask over said sacrificial oxide layer; said first implant mask having an opening over said first area and masking said second area;
   d. implanting nitrogen ions into said first area of said semiconductor substrate through said opening in said first implant mask at an energy of between about 5 KeV and 100 KeV and at a dose of between about 1E10 atm/cm$^2$ and 1E16 atm/cm$^2$;
   e. removing said first implant mask;
   f. forming a second implant mask over said sacrificial oxide layer; said second implant mask having an opening over said second area of said semiconductor substrate and masking said first area;
g. implanting argon ions into said second area of said semiconductor substrate through said opening in said second implant mask at an energy of between about 10 KeV and 100 KeV and at a dose of between about 1E10 atm/cm$^2$ and 1E16 atm/cm$^2$;
h. removing said second implant mask;
i. removing said sacrificial gate oxide layer;
j. thermally growing a gate oxide layer over said first region and said second region; said gate oxide layer having a first thickness over said first region, and a second thickness over said second region wherein said second thickness is greater than said first thickness;
k. using a reverse mask of the first mask to form a gate electrode over the first area; and
l. using a reverse mask of the second mask to form a gate electrode over the second area; whereby the gate electrode over the second area operates at a greater voltage than the gate electrode over the first area.

8. The method of claim 7 wherein said first thickness is between about 20 Angstroms and 100 Angstroms and said second thickness is between about 40 Angstroms and 200 Angstroms.

9. The method of claim 7 which further includes forming a threshold voltage implant for a low voltage gate by implanting BF$_2$ ions into said semiconductor substrate through said first implant mask prior to implanting nitrogen ions through said first implant mask.

10. The method of claim 7 which further includes forming an anti-punchtrough implant for a low voltage gate by implanting P, B, or I ions into said semiconductor substrate through said first implant mask prior to implanting nitrogen ions through said first implant mask.

11. The method of claim 7 which further includes forming a threshold voltage implant for a high voltage gate by implanting BF$_2$ ions into said semiconductor substrate through said second implant mask prior to implanting argon ions through said second implant mask.

12. The method of claim 7 which further includes forming an anti-punchthrough implant for a high voltage gate by implanting P, B, or I ions into said semiconductor substrate through said second implant mask prior to implanting argon ions through said second implant mask.

* * * * *

UNITED STATES PATENT AND TRADEMARK OFFICE
CERTIFICATE OF CORRECTION

PATENT NO.   : 6,399,448 B1
DATED        : June 4, 2002
INVENTOR(S)  : Madhusudan Mukhopadhyay, Chivukula Subrahmanyam, Yelehanka Ramachandramurthy Pradeep It is certified that error appears in the above-identified patent and that said Letters Patent is hereby corrected as shown below:

<u>Title page,</u>
Item [74], please delete "Stephen G. Stanto", and replace with
-- Stephen G. Stanton --.

Signed and Sealed this

Third Day of September, 2002

*Attest:*

*Attesting Officer*

JAMES E. ROGAN
*Director of the United States Patent and Trademark Office*